United States Patent
Nahmanny et al.

(10) Patent No.: US 8,516,410 B2
(45) Date of Patent: Aug. 20, 2013

(54) METHOD OF MIGRATING ELECTRONIC DEVICES OPERATING IN CURRENT MODE TO A TARGET TECHNOLOGY

(75) Inventors: Daniel Nahmanny, Givat Shapira (IL); Dov Ramm, Menashe (IL); Benny Sheinman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 12/345,906

(22) Filed: Dec. 30, 2008

(65) Prior Publication Data

US 2010/0169848 A1    Jul. 1, 2010

(51) Int. Cl.
  *G06F 17/50*   (2006.01)
  *G06F 9/455*   (2006.01)
  *G06F 11/22*   (2006.01)

(52) U.S. Cl.
  USPC ............ 716/103; 716/104; 716/106; 716/136

(58) Field of Classification Search
  None
  See application file for complete search history.

(56) References Cited

U.S. PATENT DOCUMENTS

| | | | |
|---|---|---|---|
| 7,409,651 B2 * | 8/2008 | Berger et al. | 716/103 |
| 7,730,433 B2 * | 6/2010 | Hammouda et al. | 716/103 |
| 7,761,820 B2 * | 7/2010 | Berger et al. | 716/122 |
| 2005/0028113 A1 * | 2/2005 | Lin et al. | 716/3 |

OTHER PUBLICATIONS

Sherif Hammouda et al., Analog IP Migration Using Design Knowledge Extraction, IEEE Custom Integrated Circuits Conference, pp. 333-336, 2004.*

Seiji Funaba et al., A Fast and Accurate Method of Redesigning Analog Subcircuits for Technology Scaling, Design Automation Conference, pp. 489-494, Feb. 1998.*

* cited by examiner

*Primary Examiner* — A. M. Thompson (57) ABSTRACT

A novel and useful method of migrating an analog or mixed signal electronic circuit from a source technology to a target technology. Devices operating in current mode and their respective voltage tuning nodes are first identified in the source technology electronic circuit. Since a device operating in current mode is less sensitive to the voltage applied to its voltage tuning node, the voltage at the voltage tuning node can be changed to achieve better current mode device performance without interfering with the biasing conditions of other devices in the circuit. This enables a circuit designer to fully exploit the two available degrees of freedom (typically width and length) when migrating the electronic device operating in current mode from a source technology to a target technology.

25 Claims, 7 Drawing Sheets

| Classification | analog — 102 | Control Param | Kv=1.0 Ki=0.5 Kgm=0.5 KLe=1.0  s +-0.1 |
|---|---|---|---|
| | Analog — 106 | Target — 108 | Switch — 110 |
| cin — 114 | 4.439114e-14 | 1.119668e-14 | 5.048102e-14 |
| gds — 116 | 0.0004708881 | 0.0001982179 | 0.001995301 |
| gm — 118 | 0.005682589 | 0.002291004 | 0.02715185 |
| ids — 120 | 0.0003070514 | 0.000153625 | 0.002607218 |
| vds — 122 | 0.385532 | 0.285532 | 0.5 |
| vdsat — 124 | 0.06487695 | 0.07069708 | 0.1215753 |
| vgs — 126 | 0.4285809 | 0.3285809 | 0.5 |
| vod — 128 | -0.006841005 | -0.06969568 | 0.133935 |
| cs — 130 | 0.5314116 | 0.6314116 | 0.0 |
| vth — 132 | 0.4354219 | 0.3982766 | 0.366065 |

100

112

Close  Help

METHOD OF MIGRATING ELECTRONIC DEVICES OPERATING IN CURRENT MODE TO A TARGET TECHNOLOGY

REFERENCE TO RELATED PATENT

The present invention is related to U.S. Pat. No. 7,409,651, issued Aug. 5, 2008, entitled "Automated Migration of Analog and Mixed-Signal VLSI Design," incorporated herein by reference in its entirety.

FIELD OF THE INVENTION

The present invention relates to the field of electronic circuit design, and more particularly relates to a method of identifying and using voltage tuning nodes to migrate one or more current mode devices in an analog or mixed signal circuit from a source technology to a target technology.

SUMMARY OF THE INVENTION

There is thus provided in accordance with the invention, a method of migrating an electronic circuit from a source technology to a target technology, the method comprising the steps of locating one or more voltage tuning nodes in the electronic circuit, defining an operational voltage range for the voltage measured at one or more located voltage tuning nodes, identifying a device operating in current mode connected to each located voltage tuning node, wherein each identified device is connected to its respective voltage tuning node via a voltage sensitive port, converting each identified device from the source technology to the target technology and replacing each identified device in the electronic circuit with its respective converted device, thereby creating an target electronic circuit in the target technology.

The method of migrating an electronic circuit from a source technology to a target technology referenced hereinabove, wherein the electronic circuit is from the group consisting of an analog circuit and a mixed signal circuit.

The method of migrating an electronic circuit from a source technology to a target technology referenced hereinabove, wherein a current measured in a device operating in current mode exhibits small sensitivity to the defined operational voltage range measured at the voltage tuning node connected to the voltage sensitive port of the current mode device The method of migrating an electronic circuit from a source technology to a target technology referenced hereinabove, wherein the voltage tuning node comprises a node in the electronic circuit connected to a voltage sensitive port of a first device and a voltage insensitive port of one or more additional devices.

The method of migrating an electronic circuit from a source technology to a target technology referenced hereinabove, wherein the step of converting comprises establishing new values for geometric properties of each identified analog device.

The method of migrating an electronic circuit from a source technology to a target technology referenced hereinabove, wherein converted device conforms to one or more defined performance parameters.

There is also provided in accordance of the invention, a computer program for migrating an electronic circuit from a source technology to a target technology, the computer program product comprising a computer usable medium having computer usable code embodied therewith, the computer usable program code comprising computer usable code configured for locating one or more voltage tuning nodes in the electronic circuit, computer usable code configured for computing an operational voltage range for voltage measured at the one or more located voltage tuning nodes, computer usable code configured for identifying a device operating in current mode connected to each located voltage tuning node, wherein each identified device is connected to its respective voltage tuning node via a voltage sensitive port, computer usable code configured for converting each identified device from the source technology to the target technology and computer usable code configured for replacing each identified device in the electronic circuit with its resulting converted device, thereby creating an target electronic circuit in the target technology.

There is further provided a method of migrating an analog or mixed signal electronic circuit from a source technology to a target technology, the method comprising the steps of locating one or more voltage tuning nodes in the electronic circuit, defining an operational voltage range for voltage measured at one or more located voltage tuning nodes, identifying a device operating in current mode connected to each located voltage tuning node, wherein each identified device is connected to its respective voltage tuning node via a voltage sensitive port, converting each identified device from the source technology to the target technology and replacing each identified device in the electronic circuit with its resulting converted device, thereby creating a target electronic circuit in the target technology.

There is also provided in accordance of the invention, a computer program for migrating an analog or mixed signal electronic circuit from a source technology to a target technology, the computer program product comprising a computer usable medium having computer usable code embodied therewith, the computer usable program code comprising computer usable code configured for locating one or more voltage tuning nodes in the electronic circuit, computer usable code configured for computing an operational voltage range for voltage measured at the one or more located voltage tuning nodes, computer usable code configured for identifying a device operating in current mode connected to each located voltage tuning node, wherein each identified device is connected to its respective voltage tuning node via a voltage sensitive port, computer usable code configured for converting each identified device from the source technology to the target technology and computer usable code configured for replacing each identified device in the electronic circuit with its resulting converted device, thereby creating an target electronic circuit in the target technology.

There is further provided a locating a voltage tuning node in an electronic circuit, the method comprising the steps of categorizing all ports of devices in the electronic circuit as either voltage sensitive or voltage insensitive ports and identifying one or more voltage tuning nodes in the electronic circuit, wherein each voltage tuning node comprises a node connected to one voltage sensitive port of a first device and a voltage insensitive port of one or more additional devices.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document:

| Term | Definition |
| --- | --- |
| AC | Alternating Current |
| ASIC | Application Specific Integrated Circuit |
| BSIM | Berkeley Short-channel IGFET Model |
| CD-ROM | Compact Disc Read Only Memory |
| CM | Current Mode |
| CPU | Central Processing Unit |
| DC | Direct Current |
| DSP | Digital Signal Processor |
| EEROM | Electrically Erasable Read Only Memory |
| EPROM | Erasable Programmable Read-Only Memory |
| FET | Field Effect Transistor |
| FPGA | Field Programmable Gate Array |
| FTP | File Transfer Protocol |
| HTTP | Hyper-Text Transport Protocol |
| I/O | Input/Output |
| KCL | Kirchhoff's Current Law |
| LAN | Local Area Network |
| MOSFET | Metal Oxide Semiconductor Field Effect Transistor |
| NIC | Network Interface Card |
| RAM | Random Access Memory |
| RC | Resistance Capacitance Models |
| RF | Radio Frequency |
| ROM | Read Only Memory |
| SPICE | Simulation Program with Integrated Circuit Emphasis |
| URL | Uniform Resource Locator |
| VCO | Voltage Controlled Oscillator |
| VLSI | Very Large Scale Integration |
| WAN | Wide Area Network |

Detailed Description of the Invention

The present invention is a method of migrating an analog or mixed signal electronic circuit from a source technology to a target technology. Current mode devices (also referred to devices operating in current mode) and their respective voltage tuning nodes are identified in the source technology electronic circuit. The current measured in a current mode device exhibits small sensitivity to the voltage measured at the voltage tuning node connected to the current mode device. The current sensitivity of a current mode device to its port voltage is much lower than the current sensitivity of a similar device not operating in current mode. By allowing a change in the voltage at the voltage tuning node, an additional degree of freedom (i.e. in addition to the width and length of the devices) is reclaimed. This reclaimed degree of freedom is used to achieve required device level performance during the migration of the device from the source technology to the target technology. Migrated devices are then reconnected in the electronic circuit, resulting in the target technology circuit adhering to the specified performance parameters.

The present invention is operative to aid in the design of automated circuit design tools to resize devices operating in current mode conditions while taking complete advantage of the two available degrees of freedom (i.e. width and length) in the device. The current of a device working in current mode conditions is primarily set by the circuit configuration and not by the voltage measured at the voltage sensitive port connected to the voltage tuning node. Therefore, voltage at the voltage tuning node can be changed to achieve better device performance without interfering with the biasing conditions of any additional devices in the circuit.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
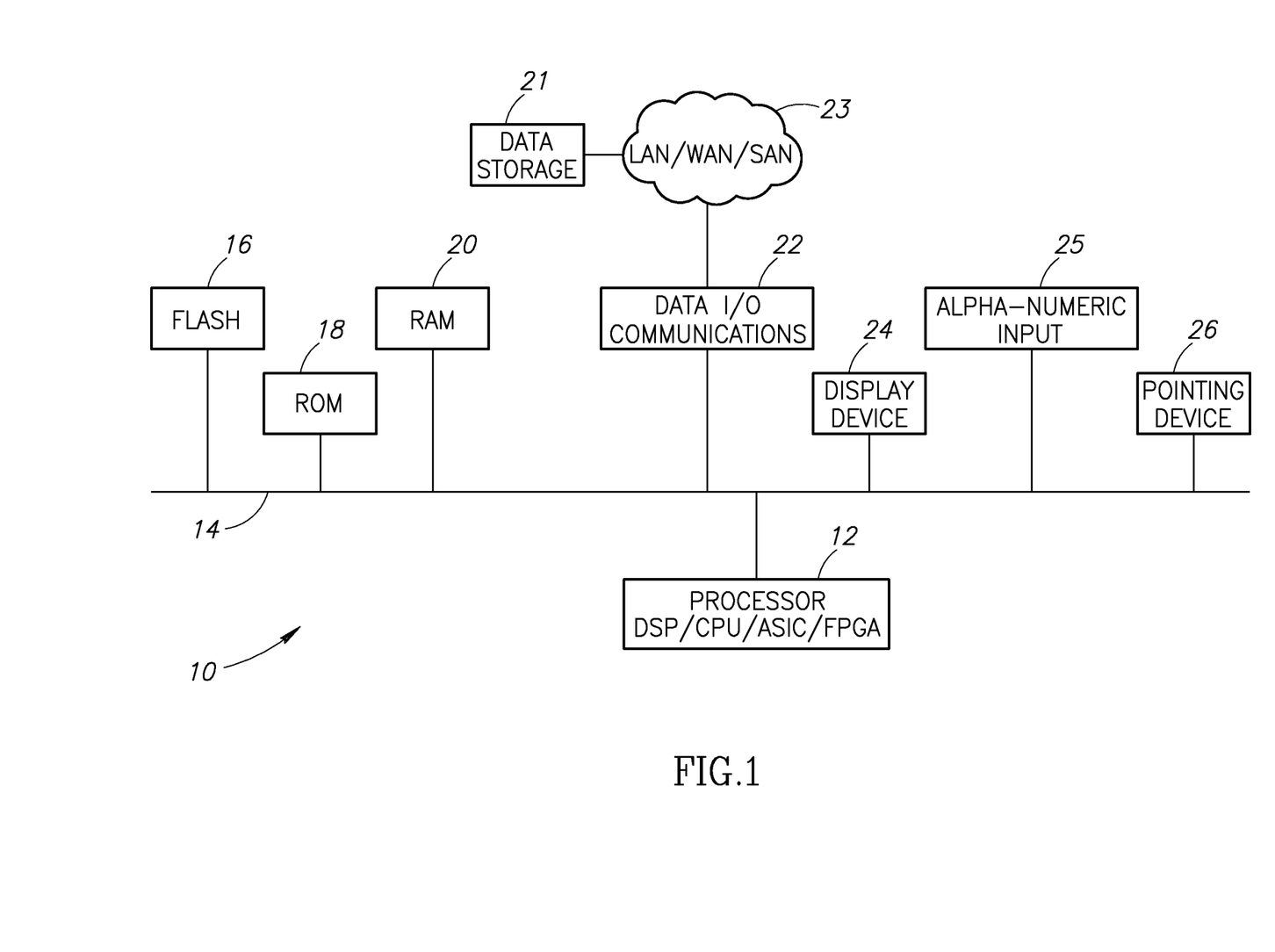
FIG. 1 is a block diagram illustrating an example computer processing system adapted to implement the analog and mixed signal electronic circuit migration method of the present invention.

A block diagram illustrating an example computer processing system adapted to implement the analog and mixed signal electronic circuit migration method of the present invention is shown in FIG. 1. The computer system, generally referenced 10, comprises a processor 12 which may comprise a digital signal processor (DSP), central processing unit (CPU), microcontroller, microprocessor, microcomputer, ASIC or FPGA core. The system also comprises static read only memory 18 and dynamic main memory 20 all in communication with the processor. The processor is also in communication, via bus 14, with a number of peripheral devices that are also included in the computer system. Peripheral devices coupled to the bus include a display device 24 (e.g., monitor), alpha-numeric input device 25 (e.g., keyboard) and pointing device 26 (e.g., mouse, tablet, etc.)

The computer system is connected to one or more external networks such as a LAN or WAN 23 via communication lines connected to the system via data I/O communications interface 22 (e.g., network interface card or NIC). The network adapters 22 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 21 for storing application programs and data. The system comprises computer readable storage medium that may include any suitable memory means, including but not limited to, magnetic storage, optical storage, semiconductor volatile or non-volatile memory, biological memory devices, or any other memory storage device.

Software adapted to implement the analog and mixed signal electronic circuit migration method of the present invention is adapted to reside on a computer readable medium, such as a magnetic disk within a disk drive unit. Alternatively, the computer readable medium may comprise a floppy disk, removable hard disk, Flash memory 16, EEROM based memory, bubble memory storage, ROM storage, distribution media, intermediate storage media, execution memory of a computer, and any other medium or device capable of storing for later reading by a computer a computer program implementing the method of this invention. The software adapted to implement the analog and mixed signal electronic circuit migration method of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the analog and mixed signal electronic circuit migration method of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk or CD-ROM or may be downloaded over a network such as the Internet using FTP, HTTP, or other suitable protocols. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Voltage Tuning Migration Method

In accordance with the invention, a source technology electronic circuit is loaded into a circuit design tool for migration to a target technology. Devices are identified which are active analog circuit devices with both a voltage sensitive port and a voltage insensitive port (e.g., transistors, diodes and capacitors). Voltage applied to a voltage sensitive port of these devices has a significant impact on the device current whereas the voltage applied at a voltage insensitive port has an insignificant impact on the device current. Ports of the identified devices in the source technology electronic circuit are categorized as either voltage sensitive or voltage insensitive. One or more voltage tuning nodes are located, comprising nodes in the source technology circuit connected to one (and only one) voltage sensitive port of a single device and voltage insensitive port(s) of one or more other devices. Devices in the circuit connected to a voltage tuning node via their voltage sensitive port are defined as current mode devices. This is due to Kirchhoff's Current Law (KCL)

$$\sum_{k=1}^{n} I_k = 0 \quad (1)$$

where I is the current, and n is the total number of currents flowing towards or away from the point. As discussed supra, a voltage tuning node has only one device connected via a voltage sensitive port. Therefore the current in all other branches (i.e. connections to the voltage tuning node) connected to voltage insensitive ports of additional devices will not change significantly. Since the sum of currents in the branches connected to the voltage tuning node will (according to KCL) remains zero, the current in the current mode device connected via its voltage sensitive port will likewise not change significantly. Therefore, the migration method of the present invention enables setting node voltages of any devices working in current mode conditions at the device level, with minimal influence on biasing conditions of additional devices in the circuit.

The current measured in a device working under current mode conditions does not depend (to the first order approximation) on the device node voltages, for voltages within the range of biasing conditions that does not run the device out of its voltage insensitive region of operation (e.g., a FET out of its saturation region). Therefore, when resizing devices working under current mode conditions, the voltage of the device port connected to the ports of any additional devices with small sensitivity to voltage changes (i.e. a voltage insensitive port of a device connected to the voltage tuning node) is determined according to the performance requirements of the device being resized, i.e. without having a significant influence on the biasing of other devices in the circuit. An example of a voltage insensitive port is the drain port of a field effect transistor (FET) in saturation region, where a change in the voltage results in a relatively small change in device current. This feature of current mode devices introduces an additional degree of freedom to the resizing process at the device level which can be used to scale the device and achieve two device level performance parameter targets (e.g., input capacitance and transconductance for a FET device).

The method of the present invention identifies devices working under current mode conditions as either (1) a device where one of the ports of the device with strong influence on device current (i.e. a voltage sensitive port, e.g., the gate or source port in a FET) is connected to a circuit node to which additional devices are only connected by their voltage insensitive port, (e.g., the drain port of a FET in saturation region which has a relatively small influence on the device current) or (2) a device where one port is matched to the same port of the device being resized (i.e. the matched devices are connected via the voltage tuning node). The two devices connected via their same respective ports are also known as mirrored devices. Matching is a known term in the art for geometrical matching between devices in analog circuits, and is used to set the current in mirrored devices (or any additional desirable device properties).

The present invention works in conjunction with the source circuit voltage transformation technique suitable for use with the present invention as taught in U.S. Pat. No. 7,409,651 cited supra. In the source circuit voltage transformation technique, the node voltages are preset prior to performing device level resizing, and can later be changed according to the circuit performance requirements. The present invention extends the device level migration for devices working under current mode conditions, and enables automatically handling devices working in current mode with no overhead related to determining the node voltages prior to the migration process. Benefits of performing resizing at the device level include (1) a computational effort linear with circuit size, therefore enabling migration of very large circuits (2) a fast device level DC simulation performed in parallel with all devices and (3) a quick setup for defining the device level target performance parameters in a hierarchical top down approach. Additional details describing the method of the automated migration of analog and mixed signal electronic circuit designs discussed supra can be found in U.S. Pat. No. 7,409,651, entitled "Automated Migration of Analog and Mixed-Signal VLSI Designs," incorporated herein by reference in its entirety. Other known circuit migration methods may also be used without departing from the scope of the present invention.

Figure 2:
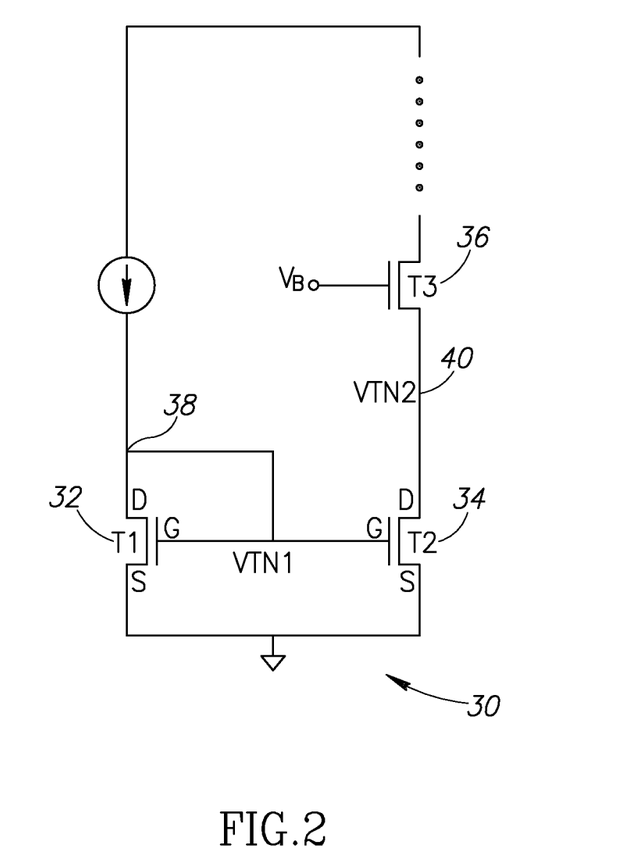
FIG. 2 is an example electronic circuit illustrating the voltage tuning node identification method of the present invention.

An example circuit with voltage tuning nodes is shown in FIG. 2. The schematic, generally referenced 30, comprises devices T1 32, T2 34, T3 36 and voltage tuning nodes VTN1 38, VTN2 40. In the schematic, all devices are working in current mode conditions. The gate port of device T2 is connected to the drain port of device T1 (i.e. its non sensitive port), the gate port of device T1 (which is matched to device T2) and the port of the current source (also a non sensitive port as the current of the current source does not depend on the VTN1 voltage). The source port of device T3 is connected only to the drain port of device T2 (i.e. its non sensitive node). Since the drain port of a MOSFET device (i.e. T2) has a relatively small influence on biasing and small signal performance parameters (assuming the device is in its saturation region) of device T2, VTN2 is identified as a voltage tuning node for T3.

To resize device T3, the method of the present invention first sets its biasing conditions (note that in an alternative embodiment, the biasing is set to the scaled value of the current running through the device in the original design before migration). The drain and source nodes of device T3 are then set to scaled values of the node voltages in the original design. The source node of the device, VTN2, is a voltage tuning node. Setting the device width and length to achieve the required device level performance under the biasing conditions previously defined, the source node of device T3 connected to VTN2 will automatically set itself to the appropriate voltage to accommodate both the required device level performance and the required performance parameters. This enables targeting two small signal performance parameters at the device level (e.g., transconductance, output resistance, channel length input capacitance etc.) with minimal influence on the performance and biasing of additional devices in the circuit.

For example, if the targets for device T3 are set to scale the current of the device to twice the value in the source design, the input capacitance of the device is preserved. The transconductance is then increased by a factor of two, and the width and length of T3, as well as the voltage value of VTN2 are then changed until a solution meeting the required goals is found. Changing the voltage at VTN2 is the additional degree of freedom recovered by the method of the present invention.

Figure 3:
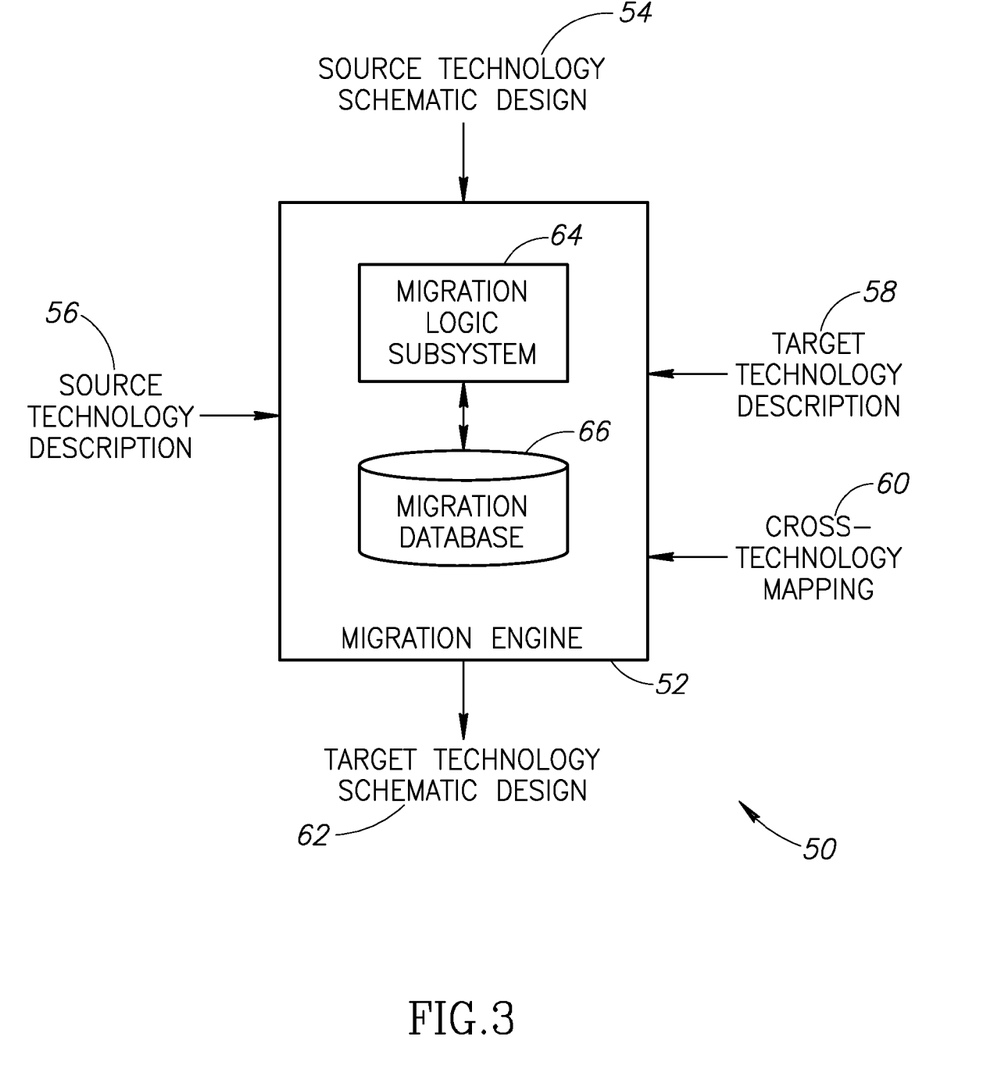
FIG. 3 is a block diagram illustrating an example computer system suitable to implement the analog and mixed signal electronic circuit migration method of the present invention.

A block diagram illustrating an example computer suitable for use with the present invention is shown in FIG. 3. The block diagram, generally referenced 50, comprises migration engine 52, source technology schematic design 54, source technology description 56, target technology description 58, cross-technology mapping 60 and target technology schematic design 62. The migration engine is further comprised of migration logic subsystem 64 and migration database 66.

In operation, the source technology schematic design is provided to the migration engine by a designer via either an input interface or a machine-to-machine interface. In the latter case, the source technology schematic design is provided to the migration engine automatically from another computer or from another application on the same computer. In one embodiment of the method of the present invention, the source technology schematic design comprises a visual schematic diagram in addition to the machine-readable circuit definitions. In this embodiment, the migration logic subsystem converts the visual schematic diagram to a corresponding visual schematic diagram of the target technology schematic design. Such a conversion of the visual schematic design enables the designer to have better visibility and control over the migration process.

The migration logic subsystem uses the migration database in the migration engine for storing device parameters in the source and target technologies and other migration related information. The migration database typically comprises one record for each device in the source circuit and in the target circuit.

In addition to the migration engine, an example computer system suitable for use with the present invention may comprise additional very large scale integration (VLSI) circuit design, simulation and testing functions, such as, direct-current (DC) simulation, layout functions, corner analysis and statistical simulation tools for assessing process variations. In some embodiments, the migration engine can be integrated as part of a conventional VLSI design tool.

Typically, the migration logic subsystem comprises a general-purpose computer, which is programmed in software to carry out the functions described herein. The software may be downloaded to the computer in electronic form, over a network, or it may alternatively be supplied to the computer on tangible media, such as CD-ROM. Alternatively, the migration logic subsystem may be implemented using a combination of hardware and software elements. The migration logic subsystem may be a standalone unit, or it may be integrated with other devices of an electronic circuit design tool.

To perform the migration process, the migration engine accepts both a source technology description and a target technology description. The source technology description, typically provided to the migration engine as a data file, comprises a list of device types used in the source technology schematic design. The device types may comprise various types of transistors, resistors, capacitors, diodes, transmission lines, etc. For each device type, the list of device types comprises a reference to a model of this device type in the source technology. The device models match the characteristics of the source technology and its corresponding fabrication process, and are often provided by the fabrication plant or device manufacturer of the source technology. In some embodiments, device models are represented in a standard format, such as BSIM models, SPICE models or behavioral models, as are known in the art. The target technology description comprises a similar list of device types and references to device models, as used in the target technology.

In operation, the migration engine also accepts a cross-technology mapping. The cross-technology mapping, typically provided as a data file, defines a mapping between source technology device types appearing in the source technology description and their corresponding target technology device types appearing in the target technology description. In some embodiments, the cross-technology mapping uniquely maps a target technology device type to each source technology device type. In an alternative embodiment, a particular source technology device type may be mapped to two or more alternative target technology device types. The actual selection of a target device in the target technology schematic design, out of the alternative device types, may depend on circuit parameters and/or designer preference. In some cases two or more source technology device types are mapped to a single target technology device type.

In some embodiments, the cross-technology mapping also comprises port mapping between the port assignments of the source and target technology devices types. If a source technology device type has a different number of ports than its corresponding target technology device type, the cross-technology mapping also comprises information regarding the desired port arrangement, for example, indication of ports that should be connected to either other ports, ground or power supply nodes.

Typically, the cross-technology mapping is produced in advance by the designer, considering the device characteristics in both the source and target technologies. In some embodiments, the source technology description, the target technology description and the cross-technology mapping are common to all migrations from a given source technology to a given target technology. Alternatively, some or all of the source technology description, the target technology description and the cross-technology mapping definitions can be updated or modified for each circuit migration.

Figure 4:
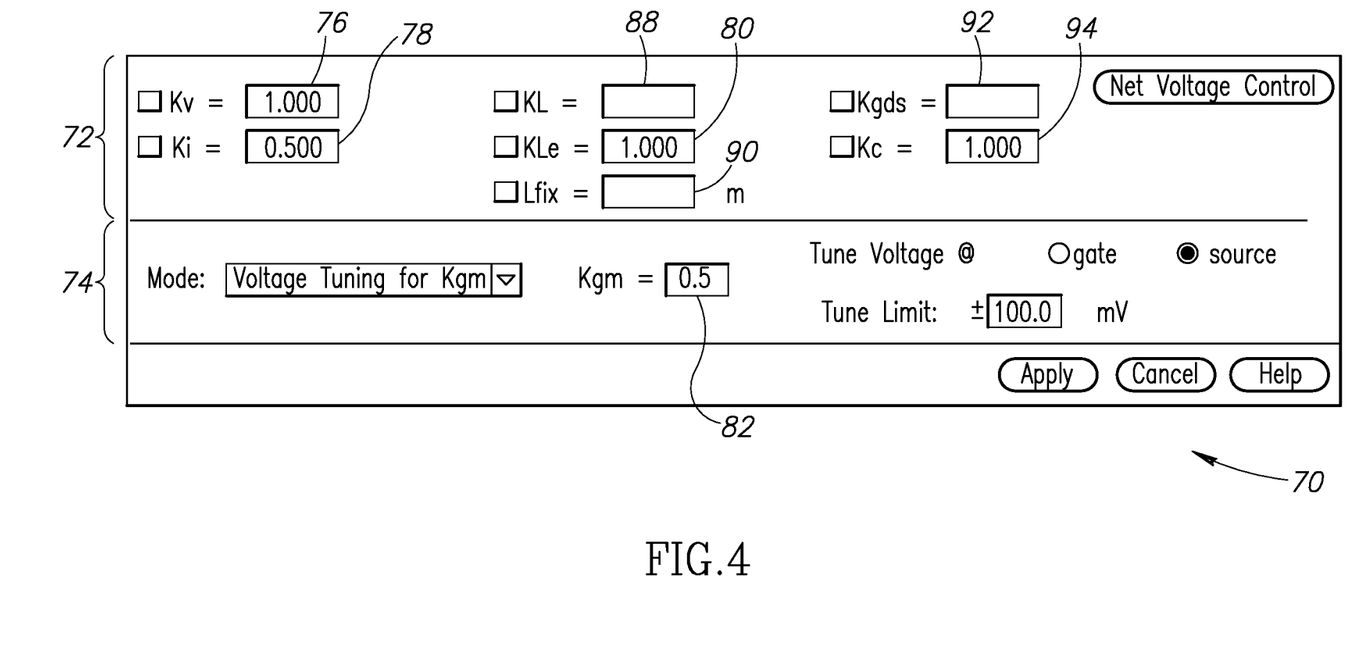
FIG. 4 is an example of an input screen for a computer system implementing the analog and mixed signal electronic circuit migration method of the present invention.
Figure 5:
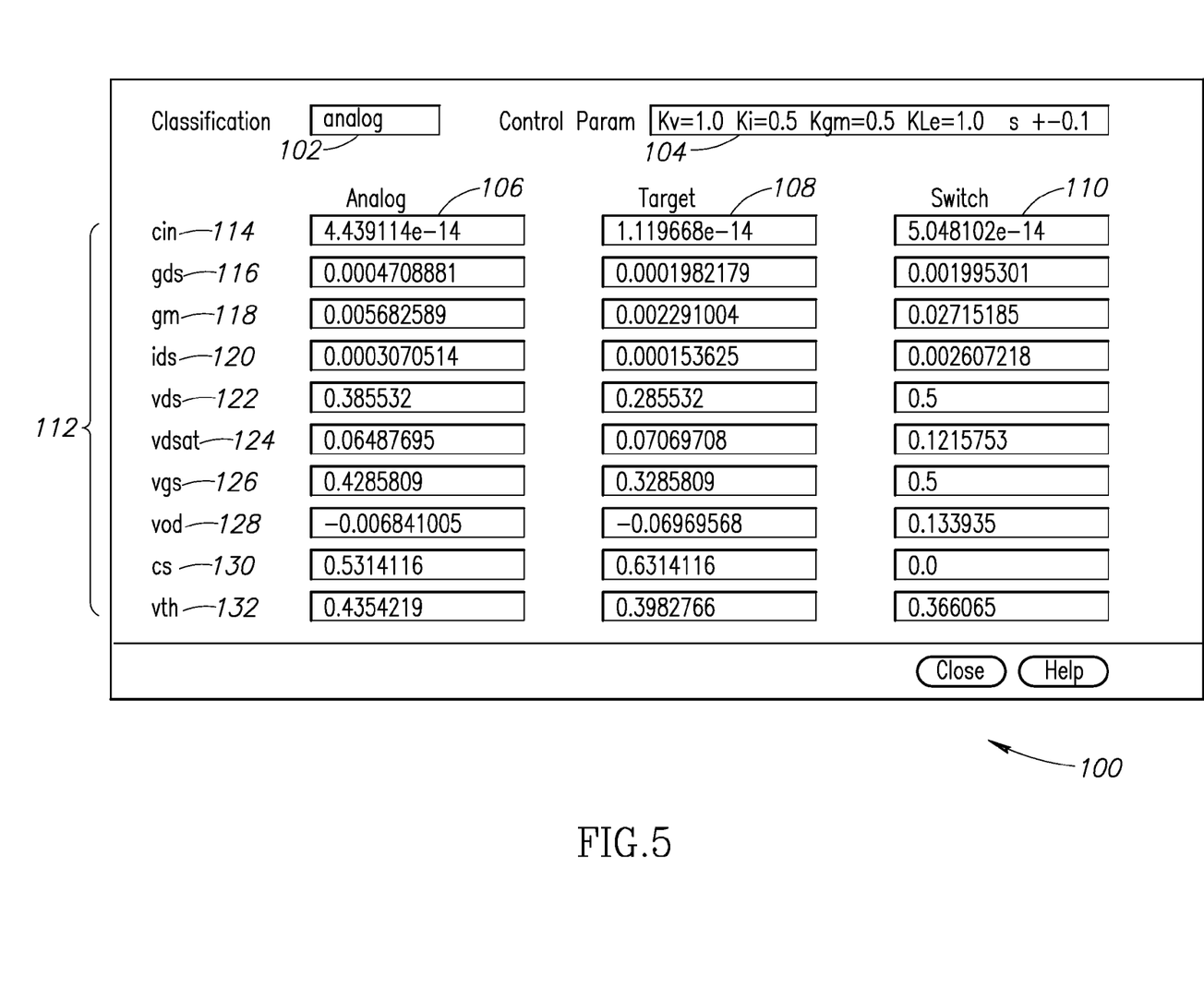
FIG. 5 is an example of an output screen for a computer system implementing the analog and mixed signal electronic circuit migration method of the present invention.

An example implementation of a user interface for a circuit migration tool implementing the analog and mixed signal electronic method of the present invention is shown in FIGS. 4 and 5. After selecting the device (or devices) to be migrated from the source technology to the target technology, FIG. 4 is displayed. The input form, generally referenced 70, comprises input parameters 72 and 74. In this example, input parameters Kv 76, Ki 78 and KLe 80 are specified as well as additional voltage tuning inputs Kgm 82 Tune Voltage 84 and input constraint Tune Limit 86. Additional parameters KL 90, Lfix 92, Kgds 94 and Kc 96 are input parameters not used in this example.

In the input parameter section of the input form, Kv (the factor defining the relationship between the source technology and target technology voltage for the migrated device) is set to 1.0, Ki (the factor defining the relationship between the source technology and target technology current for the migrated device.) is set to 0.5 and KLe (the factor defining the relationship of the device effective length between the source technology and target technology). In the constraints section of the input form, Kgm (the relationship between transconductance in the source and target technology devices) is set to 0.5, voltage tuning (i.e. Tune Voltage) is set to be performed at the device source (as opposed to the device gate) and the Tune Limit is set to 100 mV. The Tune Limit constraint limits the allowed variation in voltage of the voltage tuning node. Tuning the voltage (i.e. allowing the voltage to vary within the Tune Limit constraint) at the voltage tuning node adds a degree of freedom in the method of the present invention. In this example, it allows voltage for the target technology device to vary by plus or minus 100 mV (at the device source), compared to the corresponding voltage at the source technology device, which is scaled by the input voltage scaling factor Kv.

In this example, parameter KLe is targeted. Therefore no values were entered for KL (the factor defining the relationship of the device length between the source technology and target technology), Lfix (a preset fixed length), Kgds (the factor defining the relationship of the output conductance between the source technology and target technology) and Kc (the factor defining the relationship of the input capacitance between the source technology and target technology).

After the circuit design tool migration performs the migration, the results are displayed in FIG. 5. The output form, generally referenced 100, comprises device classification 102, input control parameters 104 columns for analog (i.e. source technology) values 106, target technology values 108, Switch (i.e. the database built in source technology for devices working under large signal conditions) 110 and output parameters 112. Output parameters 112 further comprises device values for cin (input capacitance) 114, gds (output capacitance) 116, gm (transconductance) 118, ids (current) 120, vds (drain to source voltage) 122, vdsat (device saturation voltage) 124, vgs (gate to source voltage) 126, vod (overdrive voltage vgs-vth) 128, vs (source voltage) 130 and vth (threshold voltage above which the device channel is open) 132.

In the output form, ids (current) is 0.0003070514 A for the source device and 0.000153625 A for the target device. Current for the target device is almost exactly half that of the source device, in line with Ki=0.5 control parameter. gm (transconductance) is 0.005682589 S for the source device and 0.002291004 S for the target device. Transconductance for the target device was about 40% of the source device, which closely approximates the Kgm=0.5 control parameter. This is due to the method of the present invention converging on the current (Ki=0.5), while allowing for the source voltage to vary by +/−100 mV, as shown in control parameter s+−0.1. The circuit design tool implementing the method of the present invention changed vs (source voltage) from 0.5314116 mV (source technology) to 0.6314116 mV (target technology), a difference of 0.1 mV, and within the s+−1 control parameter.

Migration Method Description

The method of the present invention accepts a source technology schematic design of a source circuit. The source technology schematic design comprises all source circuit devices and the interconnections between them, and is usually provided as a collection of data files. The source circuit comprises devices such as transistors, diodes, capacitors, resistors and transmission lines. The source circuit is to be migrated so as to provide a functional circuit in the target technology.

A migration logic subsystem implementing the method of the present invention duplicates the topology of the source technology schematic design to serve as the topology for the target technology schematic design. For each source technology device in the source technology schematic design, a corresponding target technology device is identified in accordance with cross-technology mapping.

With the exception of several specialized device types (discussed below), the method of the present invention uses a process called "basic voltage scaling" for calculating the voltages at the nodes of the target technology schematic design. In basic voltage scaling, the voltages at the nodes of the source technology circuit, including the supply voltage, are scaled using a voltage scaling factor denoted $k_v$ to produce the voltages at the respective nodes in the target technology circuit. In many cases, the scaling factor corresponds to the ratio between the supply voltages of the source and target technology circuits. For example, consider a source technology circuit in 0.25 μm technology operating at 2.5V that is migrated to a 0.12 μm technology target circuit operating at 1.2V. Typically, all voltages will be scaled by a factor of $k_v=2.5V/1.2V \approx 2.1$. Alternatively, a different supply voltage and/or a different scaling factor can be defined by the designer. In some embodiments, the ratio between supply voltages is used as the default voltage scaling factor. Source technology voltages are scaled using this factor, unless a different scaling factor is specified by the designer or by one of the automated methods described herein.

In order to determine the original node voltages, currents and small signal parameters of the source technology circuit, DC simulation of the source technology circuit is performed. The DC simulation may be performed using any suitable simulation means. In some embodiments, when the migration logic subsystem implementing the method of the present invention is part of a conventional VLSI design tool, the DC simulation that is part of the conventional design tool can be used for this purpose. The DC simulation produces the DC voltages and currents at each node of the source technology circuit. In some embodiments, an additional output of the DC simulation is a set of small signal parameters calculated for each of the source technology circuit devices, based on the device models. The DC voltages, currents and small signal parameters, which define the operating conditions of the source technology circuit, are provided to migration logic subsystem implementing the method of the present invention. In some embodiments, the voltages, currents and small signal parameters of each device in the source technology circuit are stored in a corresponding record in the migration database.

The migration logic subsystem then identifies those devices working in current mode (CM) conditions. For every device in the circuit, each port of the device is examined and identified as either a "voltage sensitive port" or a "voltage insensitive port" (based on the sensitivity of the device current and performance to the exact port voltage). After indexing the device ports for all devices in the circuits, every node in the circuit is examined. Nodes that are connected to one (and only one) voltage sensitive port of a device (i.e. all other devices that are connected to the voltage tuning node are connected via a voltage insensitive port) are identified as voltage tuning nodes. The device connected via the voltage sensitive port is identified as a device working in current mode conditions. During the resizing process, the devices operating in current mode are resized according to the scaled electrical properties of the device (based on the control parameters values), targeting the device performance. Both the geometry of the device as well as the voltage of the voltage tuning node of the device are changed to achieve the goals set for the device performance and biasing conditions. The voltage change at the voltage tuning node may be limited to a specified range to limit the search space. For devices not working in current mode, the standard voltage scaling approach is used in the resizing process.

In some embodiments, the migration logic subsystem applies different migration methods to certain specialized device types, in order to improve their functionality and performance in the target technology circuit. Examples of such device types include transistors that operate as switching devices (e.g. devices working under large signal conditions for example switches) and matched devices. Although the migration logic subsystem may apply basic voltage scaling to these device types, it is often preferable to treat them separately, sometimes with the assistance of the designer. A detailed description of a method for migration of these device types is given below.

During the migration process, the migration logic subsystem identifies devices that belong to specialized device types. In some embodiments, the migration logic subsystem examines the devices of the source technology circuit along with the results of the DC simulation, and automatically identifies devices that belong to specialized device types. In these embodiments, the migration logic subsystem may apply predefined classification criteria for performing the automatic classification. Alternatively, the designer can indicate to the migration logic subsystem devices belonging to the specialized device types. Additionally, some devices may be classified automatically, while others may be classified with designer assistance.

One example of a specialized device type comprises switching devices. While similar to digital devices, switching devices typically operate over a load-line that runs from cut-off through a linear range up to saturation. In many cases it is desirable to have some control over the performance of the migrated switching device.

In some embodiments, the migration logic subsystem uses the results of a DC simulation to automatically identify electrical operating conditions typical of switching devices, so as to identify switching devices in the source technology circuit. For example, the migration logic subsystem can identify a switching transistor by detecting an operating point typical of switching transistors, such as a high gate-to-source voltage ($V_{gs}$) and/or a high drain-to-source voltage ($V_{ds}$). In other embodiments, if the DC current flowing through a device is smaller than a predefined threshold, the device may also be classified by the migration logic subsystem as a switching device. Alternatively, switching devices may be indicated to the migration logic subsystem by the designer.

The bias voltages of switching devices are set either by the migration logic subsystem or (manually) by the designer so as to make sure the target technology device operates at an operating point suitable for switching devices. In some embodiments, the designer selects a suitable characteristic operating point of a certain switching device in the source technology circuit. Using a DC simulation of the source technology circuit, the bias voltages and small-signal parameters of the switching device in the source technology circuit are determined at a chosen operating point. The designer then sets appropriate control parameters of the migration process, so as to cause the migrated target technology switching device to operate at an operating point similar to the operating point of the corresponding source technology device. Definitions of control parameters and their effect on the migration process are described in detail below. When the source technology circuit comprises several switching devices, the use of control parameters assures that ratios and relationships between operating points of different switching devices are preserved during the migration process.

In some cases, voltage scaling does not produce satisfactory results for certain devices. Therefore, the designer may choose to calculate the biasing voltages of these devices using an iterative process. In this process, the designer specifies a voltage range for every chosen node over which iterations should be performed. For each voltage in the range, the entire device migration process is performed for the specific device. The designer evaluates a performance metric of the migrated device at each bias voltage level and determines which of the voltages produces the best performance. Alternatively, the voltage corresponding to the best performance may be determined automatically by the migration logic subsystem in an iterative process. This voltage is then used in the target technology circuit.

In some cases, the source technology circuit comprises matched devices. Matched devices are devices that are intentionally constrained to have the same geometry or to preserve a certain geometry relation between them. For example, two or more transistors can be defined as having the same channel length but may have different channel widths.

An example where devices can be represented as matched devices is the migration of a differential transistor pair, where both transistors should be converted to target technology transistors having the same geometries. Another example is a current mirror, where the current produced by a current source is scaled by two or more transistors whose relative dimensions determine the current scaling. Yet another example is the migration of dummy devices (i.e., inactive devices added to the schematic design) of the source technology circuit for layout purposes. Dummy devices should typically be migrated to target technology devices having dimensions that are similar to those of a certain active device.

In some embodiments, the migration logic subsystem also differentiates between digital devices and analog and mixed-signal devices. In some embodiments, the differentiation is performed automatically by the migration logic subsystem. Alternatively, the designer can indicate the digital and analog and mixed-signal devices to the migration logic subsystem. Analog and mixed-signal devices are migrated using the methods described herein. The classification of each device as being an analog and mixed-signal or a digital device, or a device belonging to one of the specialized device types, is typically indicated in the corresponding device record in the migration database.

In some embodiments, the migration logic subsystem marks the devices classified as belonging to specialized device types on the schematic design of the source technology circuit and displays the marked devices to the designer for verification. The designer can approve or modify the automatic classification. The designer can also modify the classification criteria used by the migration logic subsystem.

The migration logic subsystem splits the source technology circuit into sub-circuits. Typically, each sub-circuit comprises a single device such as a transistor. Alternatively, any other suitable separation of the source technology circuit into sub-circuits comprising one or more devices can be used. From this stage, the migration logic subsystem analyzes and converts each sub-circuit to the target technology individually, independent from the other sub-circuits.

The method of the present invention significantly reduces the computational complexity of the migration process. The complexity is reduced by the separation of the source technology circuit into smaller, independent sub-circuits that require a considerably smaller number of iteration steps to converge. By using the scaled voltages as constraints in the conversion of each sub-circuit, it is assured that once all sub-circuits are converted and reconnected to one another, the behavior of each device in the target circuit will be the same as its behavior in the isolated sub-circuit.

The migration logic subsystem continues the migration process by converting each source technology device to a corresponding target technology device. In some embodiments, converting each device comprises selecting a suitable target technology device from the target technology description and setting certain geometrical properties of the selected target technology device. The migration logic subsystem thus determines geometrical properties of each device in each sub-circuit. In order to calculate the geometry of each device, the designer can choose to define certain electrical properties considered to be important. The migration logic subsystem then uses the electrical properties as control parameters, or constraints, to determine the geometry of the target technology device. The control parameters chosen by the designer are also stored in the migration database.

Control parameters are often represented as scaling factors of the relevant electrical property from the source technology to the target technology, indicating which feature of the device in question should be constrained in the migration process. The following example describes several control parameters that affect the geometry and performance of a field-effect transistor (FET). Alternatively, any other suitable electrical property can be used, depending on the device type and target technology. (Many of the examples given herein address the migration of FETs. However, the disclosed methods are suitable, mutatis mutandis, for migrating any other type of devices, such as diodes. The disclosed methods can also be used to migrate passive devices such as resistors, capacitors, on-chip transmission line devices and resistance-capacitance (RC) wire models. The adaptations required for migrating these types of devices will be apparent to those skilled in the art after reading the description that follows.)

Consider a FET in the source technology circuit that is being migrated to a corresponding FET in a target technology circuit. Typically, two fundamental control parameters, namely a voltage scaling factor and a source-drain current scaling factor, are first specified. By default, the voltage scaling factor denoted $k_v$ is typically defined as $k_v = V_{dd}^{(s)}/V_{dd}^{(t)}$ wherein $V_{dd}^{(s)}$ and $V_{dd}^{(t)}$ denote the supply voltages of the source and target circuits, respectively. In some embodiments, the designer can specifically define a different voltage scaling factor for a particular device or group of devices. The source-drain current scaling factor denoted $k_I$ is defined as $k_I = I_d^{(s)}/I_d^{(t)}$, wherein $I_d^{(s)}$ denotes the drain current of the FET in the source technology circuit and $I_d^{(t)}$ denotes the corresponding drain current in the FET of the target technology circuit.

After having scaled the voltage and current of the FET, there typically remains a single degree of freedom, which enables the designer to specify one additional performance-related control parameter. In some embodiments, the designer specifies a control parameter comprising one of the following: (1) a geometrical channel length scaling factor denoted $k_L$, (2) an effective channel length scaling factor denoted $k_{Leff}$, (3) an input capacitance scaling factor denoted $k_C$ and (4) an output conductance scaling factor denoted $k_{go}$. Alternatively, any other suitable scaling factor of a property of the device in question can be used. Based on the control parameters, the migration logic subsystem calculates the geometrical properties of the target technology FET.

In the example discussed supra (FIGS. 4 and 5), KLe is one of the input parameters indicated for the device migration. The effective channel length migration factor $k_{Leff}$ is defined as $k_{Leff} = L_{eff}^{(s)}/L_{eff}^{(t)}$, wherein $L_{eff}^{(s)}$ denotes the effective channel length of the FET in the source technology circuit and $L_{eff}^{(t)}$ denotes the effective channel length of the corresponding transistor in the target technology circuit. The effective channel length is typically smaller than the geometrical length of the FET gate, denoted L. We can write $L_{eff} = L - \Delta L$, wherein $\Delta L$ is usually constant for a given technology. Thus, the geometrical gate length of the target technology FET can be written as $$L^{(t)} = \frac{L^{(s)} - \Delta L^{(s)}}{k_{Leff}} + \Delta L^{(t)} \quad (2)$$

where $\Delta L^{(s)}$ and $\Delta L^{(t)}$ are constant per the given source and target technologies.

In some embodiments, the first approximation of width W can be improved by iteratively substituting W estimates back into the FET model. In many cases, several iterations (typically between two and six) are sufficient for calculating the value of W. The convergence of W estimation is often faster for long channel FETs than for short channel FETs. The inventor's experience shows that even for a minimum geometrical channel length of 90 nm, six iterations are usually sufficient.

At this stage, the migration logic subsystem has converted all sub-circuits of the source technology circuit. For each target technology device in the sub-circuits, the migration logic subsystem has estimated the geometrical properties of the device. The migration logic subsystem stores the estimated geometrical properties in the migration database.

The migration logic subsystem then reconnects the sub-circuits to form a target technology circuit. The re-connected target technology circuit has the same topology as the original source technology circuit, and comprises the previously calculated voltages, currents and geometrical properties.

In some embodiments, the designer examines and verifies the performance of the target technology circuit. For this purpose, the designer can perform any suitable simulation or verification procedure including, for example, DC simulation, alternating-current (AC) simulation and transient simulation. In some cases, a DC simulation of the target technology circuit is superfluous, since it is already provided by the DC simulation of the sub-circuits in the target technology, performed during the conversion process.

For verification, the designer can examine the target technology circuit as a whole and/or the performance of specific devices or sub-circuits. The designer can query the migration database for different parameters of the source technology circuit and the target technology circuit, electrical and geometrical properties of devices, control parameters, small-signal parameters of devices, voltages, currents, etc. in order to verify the performance of the target technology circuit.

When the designer decides that the performance of the target technology circuit is satisfactory, the migration engine outputs the target technology schematic design. If, on the other hand, the designer decides that the performance of the target circuit is not satisfactory, the designer can then modify some of the control parameters so as to improve the performance of the target technology circuit in the next iteration. The migration logic subsystem then performs another iteration of the migration process using the modified control parameters. In many cases, the migration logic subsystem only needs to re-convert a small part of the sub-circuits affected by the modification and not the entire circuit. This feature is another benefit of the independence between sub-circuits, achieved through voltage distribution.

In some embodiments, the entire migration process may be performed automatically by the migration engine without human intervention. In some embodiments, the migration logic subsystem also performs an automatic schematic symbol replacement procedure after generating the target technology circuit. In some cases, the schematic symbol representation and the port arrangement of some devices may take different forms in the source and target technology circuits. These differences can occur, for example, when the source and target circuits use design kits and/or models from different vendors. In such cases, the migration logic subsystem can automatically introduce the desired symbol representation in the schematic design of the target technology circuit, perform the necessary re-routing to account for changes in port arrangement, and update the target technology circuit accordingly.

In some embodiments, when using the method the present invention, the designer can modify a performance metric of the target technology circuit to be different from the performance of the source technology circuit. For example, let the source technology circuit be a voltage-controlled oscillator (VCO), designed in the source technology to produce an output signal within a certain frequency range. When migrating this VCO circuit to the target technology, the designer can choose to change the circuit parameters (such as by changing device control parameters) so that the target technology circuit is a VCO having a different frequency range.

Figure 6:
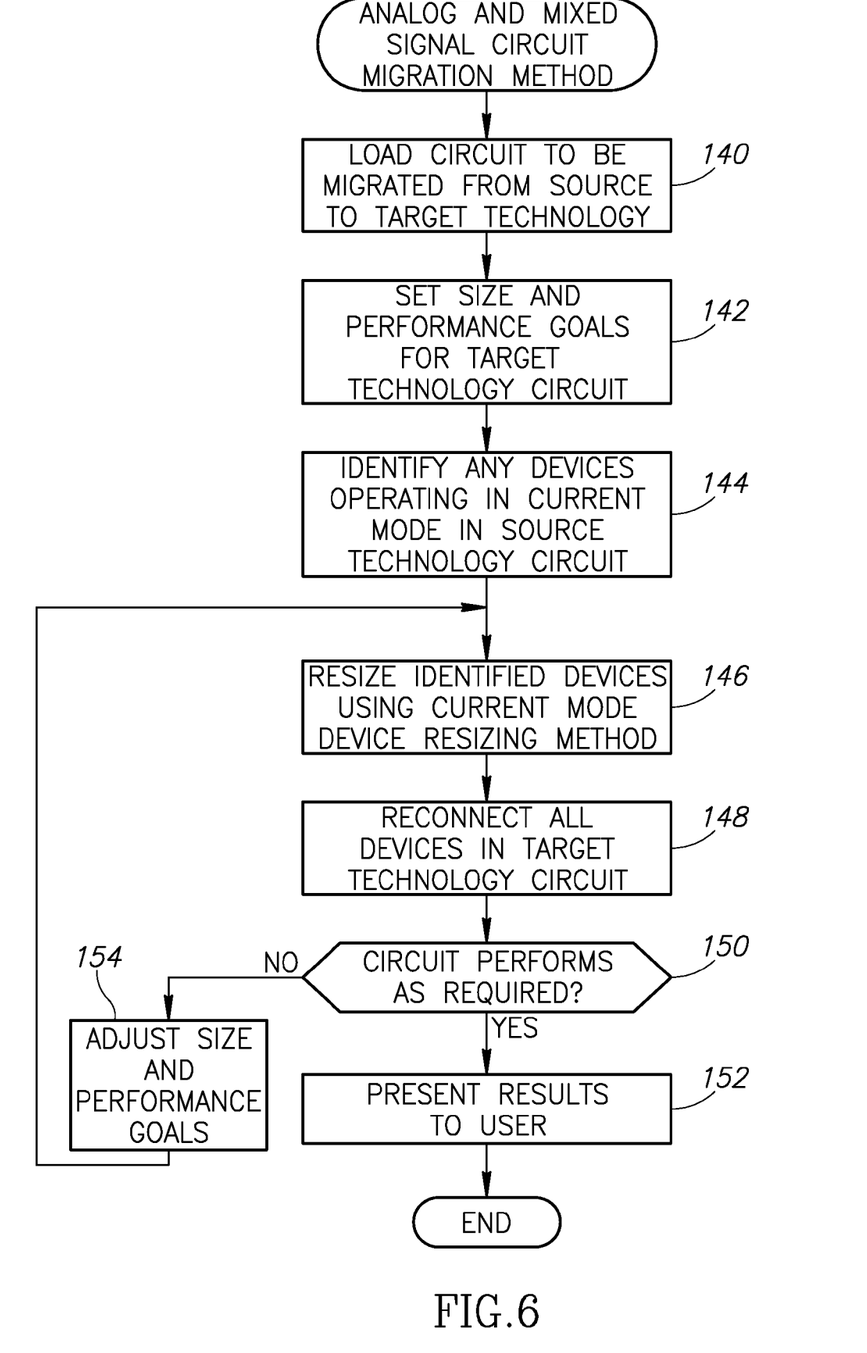
FIG. 6 is a flow diagram illustrating the analog and mixed signal electronic circuit migration method of the present invention.

A flow diagram illustrating the analog and mixed signal electronic circuit migration method of the present invention is shown in FIG. 6. The circuit to be migrated from the source technology to the target technology is loaded (step 140) and the size and performance goals are set for the resulting target technology circuit (step 142). Devices operating in current mode are then identified in the source technology circuit (step 144) and the identified devices are resized using the current mode device resizing method of the present invention (step 146). All the migrated devices are then reconnected thereby creating an electronic circuit in the target technology (step 148). If the electronic circuit in the target technology performs as required (step 150) then the resulting schematic is presented to the user (step 152). If the electronic circuit in the target technology does not perform as required then the size and performance goals are adjusted (step 154) and the method of the present invention returns to step 146.

Figure 7:
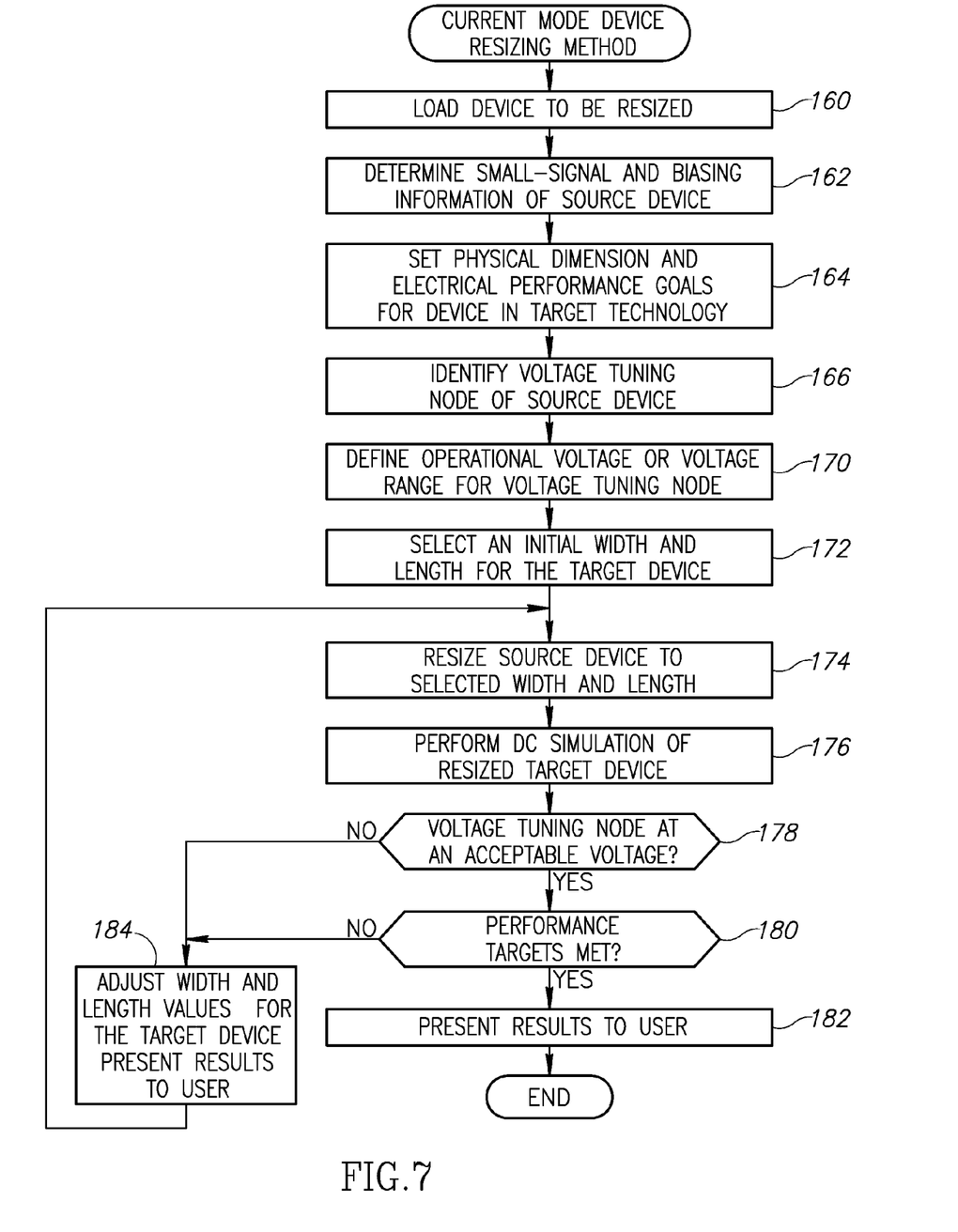
FIG. 7 is a flow diagram illustrating the current mode device resizing method of the present invention.

A flow diagram illustrating the current mode device resizing method of the present invention is shown in FIG. 7. The device to be resized is loaded (step 160) and the small-signal and biasing information of the source device is determined (step 162). The physical dimension and electrical performance goals for the target technology device are then set (step 164) and the voltage tuning node connected to the source technology device operating in current mode is identified (step 166). As discussed supra, the voltage tuning node is a node in the electronic circuit connected to the voltage sensitive port of a device operating in current mode (in this case, the device to be resized) and the voltage insensitive port of one or more additional devices.

The operational voltage range is then defined for the identified voltage tuning node (step 168). Note that while typically small voltage ranges are used as input parameters (e.g., the +/−100 mV range in FIGS. 4 and 5 discussed supra), the range of acceptable voltages for a voltage tuning node can be much greater. After an initial length and width is selected for the target technology device (step 170), the width and length, the source technology device is resized (step 172) using the selected width and length, and a DC simulation is performed to test the resulting target mode device (step 174). If the DC simulation shows that the voltage at the voltage tuning node is in the acceptable range (step 176) and performance goals (e.g., device current) are met (step 178) then the migrated circuit is presented to the user (step 180). Otherwise, the length and/or width are adjusted for the target technology device, and the method of the present invention returns to step 172.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of migrating an electronic circuit incorporating a plurality of analog devices from a source technology to a target technology, the method comprising:
   loading said electronic circuit to be migrated from said source technology to said target technology;
   determining small-signal parameters and biasing conditions of devices in said electronic circuit;
   for each device, identifying voltage sensitive ports and voltage insensitive ports;
   for each node in said electronic circuit, counting the number of devices connected via a voltage sensitive port to a circuit node and the number of devices connected via a voltage insensitive port to the circuit node;
   defining as a voltage tuning node of said electronic circuit those circuit nodes to which a device is connected via a voltage sensitive port while all additional devices connected to the circuit node are connected via a voltage insensitive port;
   identifying devices that are connected to a voltage tuning node via voltage sensitive port as devices operating in current mode conditions, wherein each identified device is connected to its respective voltage tuning node via a voltage sensitive port, whereby permitting a change in voltage at said voltage tuning nodes yields a degree of freedom in addition to that provided by the length and width of devices in said electronic circuit due to the current in current mode devices being relatively insensitive to port voltage at voltage tuning nodes;
   for all devices operating in current mode conditions, resizing each said identified device from said source technology to said target technology, to yield adjusted device sizes, taking into account that each identified device operates in current mode conditions and wherein both the geometry of the identified device and the voltage at the voltage tuning node connected to the identified device via the voltage sensitive port of the identified device are modified to achieve performance goals; and
   replacing each said identified device in said electronic circuit with its respective said resized device, thereby creating a target electronic circuit in said target technology.

2. The method according to claim 1, further comprising determining, for each voltage tuning node of said electronic circuit, the voltage range for which the devices connected via their voltage insensitive port do not alter their operating condition and thus their currents.

3. The method according to claim 2, further comprising adjusting the device size and performance goals in the event said target electronic circuit does not perform as required.

4. The method according to claim 3, further comprising performing one or more additional iterations of resizing and replacing in the event said target electronic circuit does not perform as required using said adjusted device sizes as a starting point therefor.

5. The method according to claim 1, wherein said step of resizing comprises establishing new values for geometric properties of each analog device identified.

6. The method according to claim 1, wherein said step of resizing comprises conforming said resized device to one or more defined performance parameters.

7. A computer program product apparatus for migrating an electronic circuit incorporating a plurality of analog devices from a source technology to a target technology, the computer program product apparatus comprising:
 a non-transitory computer usable storage medium having computer usable code embodied therewith, the computer usable program code comprising:
 computer usable code configured for loading said electronic circuit to be migrated from said source technology to said target technology;
 computer usable code configured for determining small-signal parameters and biasing conditions of devices in said electronic circuit;
 computer usable code configured for identifying, for each device, voltage sensitive ports and voltage insensitive ports;
 computer usable code configured for counting, for each node in said electronic circuit, the number of devices connected via a voltage sensitive port to a circuit node and the number of devices connected via a voltage insensitive port to the circuit node;
 computer usable code configured for defining as a voltage tuning node of said electronic circuit those circuit nodes to which a device is connected via a voltage sensitive port while all additional devices connected to the circuit node are connected via a voltage insensitive port;
 computer usable code configured for identifying devices that are connected to a voltage tuning node via voltage sensitive port as devices operating in current mode conditions, wherein each identified device is connected to its respective voltage tuning node via a voltage sensitive port, whereby permitting a change in voltage at said voltage tuning nodes yields a degree of freedom in addition to that provided by the length and width of devices in said electronic circuit due to the current in current mode devices being relatively insensitive to port voltage at voltage tuning nodes;
 computer usable code configured for resizing, for all devices operating in current mode conditions, each said identified device from said source technology to said target technology taking into account that each identified device operates in current mode conditions and wherein both the geometry of the identified device and the voltage at the voltage tuning node connected to the identified device via the voltage sensitive port of the identified device are modified to achieve performance goals; and
 computer usable code configured for replacing each said identified device in said electronic circuit with its respective said resized device, thereby creating a target electronic circuit in said target technology.

8. The computer program product apparatus of claim 7, further comprising computer usable code configured for determining, for each voltage tuning node of said electronic circuit, the voltage range for which the devices connected via their voltage insensitive port do not significantly alter their operating condition and thus their currents.

9. The computer program product apparatus of claim 7, wherein resizing each identified device comprises measuring a current in a device operating in current mode exhibiting small sensitivity to said defined operational voltage range measured at said voltage tuning node connected to said voltage sensitive port of said current mode device.

10. The computer program product apparatus of claim 7, further comprising performing one or more additional iterations of resizing and replacing in the event said target electronic circuit does not perform as required using said adjusted device sizes as a starting point.

11. The computer program product apparatus of claim 7, wherein said computer usable code configured for resizing comprises establishing new values for geometric properties of each analog device identified.

12. The computer program product appartus of claim 7, wherein resizing comprises conforming said resized device to one or more defined performance parameters.

13. An apparatus for migrating an analog or mixed signal electronic circuit incorporating a plurality of analog devices from a source technology to a target technology, comprising:
 a migration database operative to store a plurality of parameters associated with source and target device technology;
 a migration logic subsystem, operative to:
  load said electronic circuit to be migrated from said source technology to said target technology;
  determine small-signal parameters and biasing conditions of devices in said analog or mixed signal electronic circuit;
  for each device, identify voltage sensitive ports and voltage insensitive ports;
  for each node in said analog or mixed signal electronic circuit, count the number of devices connected via a voltage sensitive port to a circuit node and the number of devices connected via a voltage insensitive port to the circuit node;
  define as a voltage tuning node of said electronic circuit those circuit nodes to which a device is connected via a voltage sensitive port while all additional devices connected to the circuit node are connected via a voltage insensitive port;
  identify devices that are connected to a voltage tuning node via voltage sensitive ports as devices operating in current mode conditions, wherein each identified device is connected to its respective voltage tuning node via a voltage sensitive port, whereby permitting a change in voltage at said voltage tuning nodes yields a degree of freedom in addition to that provided by the length and width of devices in said electronic circuit due to the current in current mode devices being relatively insensitive to port voltage at voltage tuning nodes;
  for all devices operating in current mode conditions, resize each said identified device from said source technology to said target technology taking into account that each identified device operates in current mode conditions and wherein both the geometry of the identified device and the voltage at the voltage tuning node connected to the device via its voltage sensitive port of the identified device are modified to achieve performance goals; and
  replace each said identified device in said analog or mixed signal electronic circuit with its respective said resized device, thereby creating a target electronic circuit in said target technology.

14. The apparatus according to claim 13, said migration logic subsystem further operative to adjust the device size and performance goals in the event said target electronic circuit does not perform as required.

15. The apparatus according to claim 13, wherein further comprising, for each voltage tuning node of said electronic circuit, determine the voltage range for which the devices connected via their voltage insensitive port does not significantly alter their operating condition and thus their currents.

16. The apparatus according to claim 13, wherein said migration logic subsystem further operative to establish new values for geometric properties of each analog device identified.

17. The apparatus according to claim 13, wherein said migration logic subsystem further operative to resize each said identified device such that said resized device conforms to one or more defined performance parameters.

18. A computer program product apparatus for migrating an analog or mixed signal electronic circuit from a source technology to a target technology, the computer program product apparatus comprising:
   a non-transitory computer usable storage medium having computer usable code embodied therewith, the computer usable program code comprising:
   computer usable code configured for categorizing all ports of devices in an electronic circuit as either voltage sensitive or voltage insensitive ports;
   computer usable code configured for defining as a voltage tuning node of said electronic circuit those circuit nodes to which a device is connected via a voltage sensitive port while all additional devices connected to the circuit node are connected via a voltage insensitive port;
   computer usable code configured for identifying one or more said voltage tuning nodes in said electronic circuit, wherein each said voltage tuning node comprises a node connected to a voltage sensitive port of a first device and a voltage insensitive port of one or more additional devices, and wherein devices in said electronic circuit connected to a voltage tuning mode via a voltage sensitive port are considered current mode devices whereby node voltages of current mode devices are set at a device level, wherein each identified device is connected to its respective voltage tuning node via a voltage sensitive port, whereby permitting a change in voltage at said voltage tuning nodes yields a degree of freedom in addition to that provided by the length and width of devices in said electronic circuit due to the current in current mode devices being relatively insensitive to port voltage at voltage tuning nodes; and
   computer usable code configured for resizing electronic devices operating under current mode conditions to yield adjusted device sizes whereby the voltage of a device port connected to voltage insensitive ports of other devices is determined according to the performance requirements of the device being resized.

19. The computer program product apparatus of claim 18, further comprising computer usable code configured for measuring a current in a device operating in current mode that is insensitive to said defined operational voltage range measured at said voltage tuning node connected to said voltage sensitive port of said current mode device.

20. The computer program product apparatus of claim 18, further comprising computer usable code configured for performing one or more additional iterations of resizing and replacing in the event said target electronic circuit does not perform as required using said adjusted device sizes as a starting point.

21. The computer program product apparatus of claim 18, wherein said computer usable code configured for resizing comprises computer usable code configured for establishing new values for geometric properties of each analog device identified.

22. The computer program product apparatus of claim 18, wherein said computer usable code configured for resizing is operative to resize each identified device such that each resized device conforms to one or more defined performance parameters.

23. A method of migrating electronic devices in a source electronic circuit from a source electronic circuit technology to a target electronic circuit technology, said method comprising:
   categorizing all ports of devices in said source electronic circuit as either voltage sensitive or voltage insensitive ports;
   defining as a voltage tuning node of said electronic circuit those circuit nodes to which a device is connected via a voltage sensitive port while all additional devices connected to the circuit node are connected via a voltage insensitive port;
   for each voltage tuning node of said electronic circuit, determining the voltage range for which the devices connected via their voltage insensitive port does not significantly alter their operating condition and thus their currents;
   identifying one or more said voltage tuning nodes in said source electronic circuit, wherein each said voltage tuning node comprises a node connected to a voltage sensitive port of a first device and a voltage insensitive port of one or more additional devices, and wherein devices in said source electronic circuit connected to a voltage tuning mode via a voltage sensitive port are considered current mode devices whereby node voltages of current mode devices are set at the device level wherein each identified device is connected to its respective voltage tuning node via a voltage sensitive port, whereby permitting a change in voltage at said voltage tuning nodes yields a degree of freedom in addition to that provided by the length and width of devices in said electronic circuit due to the current in current mode devices being relatively insensitive to port voltage at voltage tuning nodes; and
   for all devices operating in current mode conditions, resizing electronic devices operating under current mode conditions whereby the voltage of a device port connected to voltage insensitive ports of other devices is determined according to the performance requirements of the device being resized, thereby generating a target electronic circuit in said target electronic circuit technology.

24. The method according to claim 23, further comprising determining whether said target electronic circuit performs as required.

25. The method according to claim 24, further comprising adjusting the device size and performance goals in the event said target electronic circuit does not perform as required.

* * * * *